United States Patent
Krishnaswamy et al.

(10) Patent No.: US 9,438,195 B2
(45) Date of Patent: Sep. 6, 2016

(54) VARIABLE EQUALIZATION

(71) Applicant: Apple Inc., Cupertino, CA (US)

(72) Inventors: Arvindh Krishnaswamy, San Jose, CA (US); Joseph M. Williams, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 14/502,997

(22) Filed: Sep. 30, 2014

(65) Prior Publication Data

US 2015/0341008 A1    Nov. 26, 2015

Related U.S. Application Data

(60) Provisional application No. 62/002,443, filed on May 23, 2014.

(51) Int. Cl.
*H03G 5/16*    (2006.01)
*H03G 5/00*    (2006.01)

(52) U.S. Cl.
CPC .............. *H03G 5/165* (2013.01); *H03G 5/005* (2013.01)

(58) Field of Classification Search
None
See application file for complete search history.

(56) References Cited

U.S. PATENT DOCUMENTS

| | | | |
|---|---|---|---|
| 5,659,619 A * | 8/1997 | Abel | H04S 1/002 381/1 |
| 6,173,061 B1 * | 1/2001 | Norris | H04R 5/00 381/1 |
| 7,936,887 B2 | 5/2011 | Smyth | |
| 8,077,880 B2 | 12/2011 | Bharitkar et al. | |
| 8,234,110 B2 | 7/2012 | Meng et al. | |
| 2004/0071299 A1 * | 4/2004 | Yoshino | H03G 5/165 381/98 |
| 2005/0065788 A1 * | 3/2005 | Stachurski | G10L 19/20 704/229 |
| 2008/0240467 A1 * | 10/2008 | Oliver | H03H 17/04 381/103 |
| 2014/0254828 A1 * | 9/2014 | Ray | H03G 5/165 381/103 |
| 2015/0341008 A1 * | 11/2015 | Krishnaswamy | H03G 5/16 381/103 |

FOREIGN PATENT DOCUMENTS

EP          2077649 A1    7/2009
WO    WO-2009155057 A1    12/2009

* cited by examiner

*Primary Examiner* — Peter Vincent Agustin
(74) *Attorney, Agent, or Firm* — Blakely, Sokoloff, Taylor & Zafman LLP

(57) ABSTRACT

An equalizer that linearly interpolates between two equalization states when transitioning from one equalization state to the other equalization state is described. The equalizer includes a transfer function generator and an equalization module. Each equalization state is defined or determined based on a set of parameters. The transfer function generator generates a set of interpolated transfer functions by performing linear interpolation on a first equalization state and a second equalization state based on the set of parameters. The linear interpolation is performed on corresponding Z-domain poles and zeros of the transfer functions of the first and second equalization states. The equalization module applies the set of interpolated transfer functions generated by the transfer function generator to an input audio signal.

18 Claims, 8 Drawing Sheets

VARIABLE EQUALIZATION

RELATED MATTERS

This application claims the benefit of the earlier filing date of U.S. Provisional Application No. 62/002,443, filed May 23, 2014, entitled "Variable Equalization".

FIELD

An embodiment of the disclosure is related to digital audio signal processing techniques, and particularly to techniques for equalization.

BACKGROUND

In sound recording and reproduction, equalization is the process commonly used to alter the frequency response of an audio system using linear filters. Most hi-fi equipment uses relatively simple filters to make bass and treble adjustments. Graphic and parametric equalizers have much more flexibility in tailoring the frequency content of an audio signal. An equalizer is the circuit or equipment used to achieve equalization. Equalizers adjust the amplitude of audio signals at particular frequencies.

Equalizers are used in recording studios, broadcast studios, and live sound reinforcement to correct the response of microphones, instrument pick-ups, loudspeakers, and hall acoustics. Equalization may also be used to eliminate unwanted sounds, make certain instruments or voices more prominent, enhance particular aspects of an instrument's tone, or combat feedback in a public address system. Equalizers are also used in music production to adjust the timbre of individual instruments by adjusting their frequency content and to fit individual instruments within the overall frequency spectrum of the mix.

An equalizer receives an input audio signal X, applies a transfer function H on it, and outputs an audio signal Y. This process can be represented (in the frequency domain) as $Y = H\ X$.

The linear filter used by the equalizer is designed to implement the transfer function H. However, when the equalizer switches from one transfer function to another transfer function, the transition can be abrupt and aesthetically unpleasant to listeners of the audio.

SUMMARY

An equalizer that linearly interpolates between two equalization states when transitioning from one equalization state to the other equalization state is described. An embodiment of the equalizer includes a transfer function generator and an equalization module. Each equalization state is defined or determined based on a set of parameters. The transfer function generator generates a set of interpolated transfer functions by performing linear interpolation on a first equalization state and a second equalization state based on the set of parameters. The linear interpolation is performed on corresponding Z-domain poles and zeros of the transfer functions of the first and second equalization states. The equalization module applies the set of interpolated transfer functions generated by the transfer function generator to an input audio signal.

In order to perform linear interpolation on corresponding Z-domain poles and zeros of the transfer functions of the first and second equalization states, for each pole of the transfer function of the first equalization state, one embodiment of the transfer function generator performs linear interpolation on the pole and a corresponding pole of the transfer function of the second equalization state based on the set of parameters. For each zero of the transfer function of the first equalization state, the transfer function generator of the same embodiment performs linear interpolation on the zero and a corresponding zero of the transfer function of the second equalization state based on the set of parameters.

In one embodiment, in order to perform linear interpolation on two poles based on the set of parameters, the transfer function generator performs linear interpolation on the radius of the two poles based on the set of parameters and performs linear interpolation on the angle of the two poles based on the set of parameters. In one embodiment, in order to perform linear interpolation on two zeros based on the set of parameters, the transfer function generator performs linear interpolation on the radius of the two zeros based on the set of parameters and performs linear interpolation on the angle of the two zeros based on the set of parameters.

The linear interpolation generates a set of interpolated equalization states. In one embodiment, each of the set of interpolated transfer functions corresponds to an interpolated equalization state of the set of interpolated equalization states. In one embodiment, the equalization module applies the set of interpolated transfer functions in a sequence in which the set of interpolated equalization states gradually transition from the first equalization state to the second equalization state. In one embodiment, the equalization module further applies transfer functions of the first equalization state and the second equalization state.

A method that linearly interpolates between two equalization filters when transitioning from one equalization filter to the other equalization filter is described. The method receives an input audio signal and applies a first equalization filter to the input audio signal. Each equalization filter is defined or determined based on a set of parameters. The method receives a request to change from the first equalization filter to a second equalization filter based on the set of parameters. The method determines Z-domain poles and zeros for the first and second equalization filters. The method performs linear interpolation on corresponding Z-domain poles and zeros of the first equalization filter and the second equalization filter based on the set of parameters. The method constructs interpolated equalization filters between the first and second equalization filters using the interpolated poles and zeros. The method applies the interpolated equalization filters to the input audio signal in a sequence in which the interpolated equalization filters gradually transition from the first equalization filter to the second equalization filter.

In order to perform linear interpolation on corresponding Z-domain poles and zeros of the first and second equalization filters, for each pole of the first equalization filter, one embodiment of the method performs linear interpolation on the pole and a corresponding pole of the second equalization filter based on the set of parameters. For each zero of the first equalization filter, the method of the same embodiment performs linear interpolation on the zero and a corresponding zero of the second equalization filter based on the set of parameters.

In one embodiment, in order to perform linear interpolation on two poles based on the set of parameters, the method performs linear interpolation on the radius of the two poles based on the set of parameters and performs linear interpolation on the angle of the two poles based on the set of parameters. In one embodiment, in order to perform linear interpolation on two zeros based on the set of parameters, the method performs linear interpolation on the radius of the two zeros based on the set of parameters and performs linear interpolation on angle of the two zeros based on the set of parameters.

The above summary does not include an exhaustive list of all aspects of the disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The present disclosure is illustrated by way of example and not limitation in the figures of the accompanying drawings in which like references indicate similar elements.

DETAILED DESCRIPTION

An equalizer that linearly interpolates between two equalization states when transitioning from one equalization state to the other equalization state is described. In the following description, numerous specific details are set forth to provide thorough explanation of embodiments of the disclosure. It will be apparent, however, to one skilled in the art, that embodiments of the disclosure may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the disclosure. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow are performed by processing logic that comprises hardware (e.g., circuitry, dedicated logic, etc.), software (such as is run on a general-purpose device or a dedicated machine), or a combination of both. Although the processes are described below in terms of some sequential operations, it should be appreciated that some of the operations described may be performed in different order. Moreover, some operations may be performed in parallel rather than sequentially.

Figure 1:
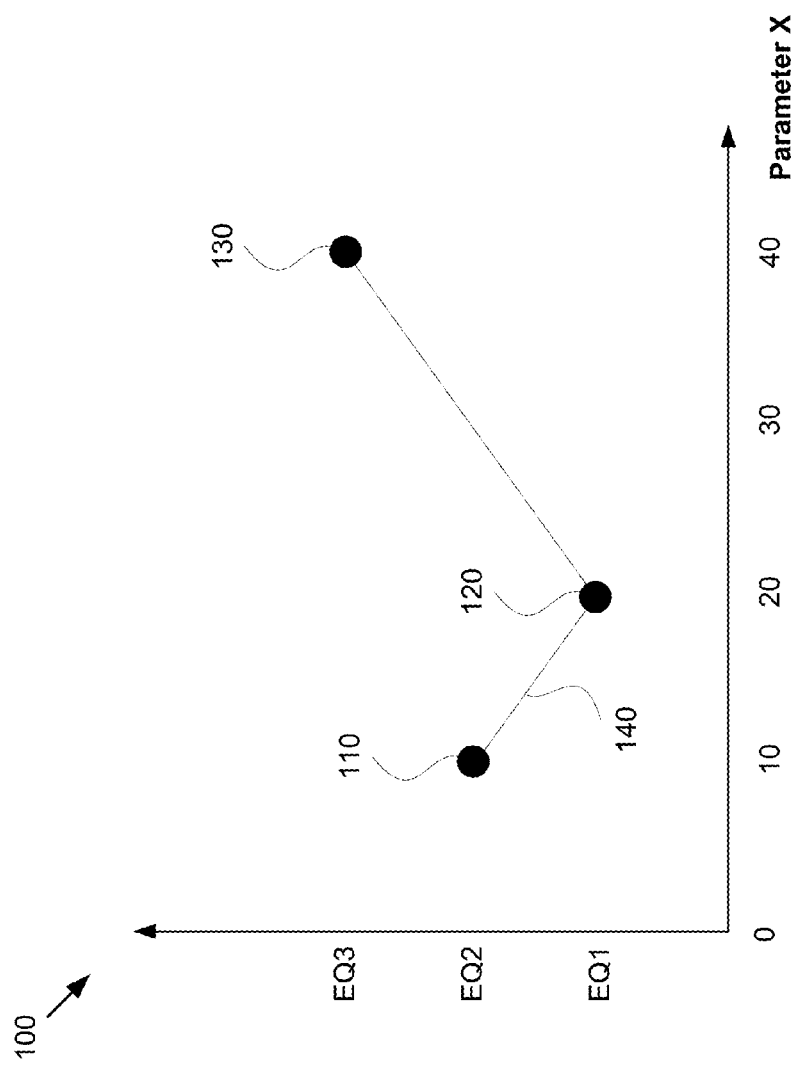
FIG. 1 displays a chart that illustrates variable equalization based on a single parameter.

FIG. 1 displays a chart 100 that illustrates variable equalization based on a single parameter. Specifically, this figure shows that the equalization state of an equalizer changes when the parameter X changes. As illustrated, x-axis of chart 100 represents different values of the parameter X, while y-axis of chart 100 represents different equalization states of the equalizer. Therefore, point 110 represents that the equalization state of the equalizer is EQ2 when X=10. Similarly, point 120 represents that the equalization state of the equalizer is EQ1 when X=20, and point 130 represents that the equalization state of the equalizer is EQ 3 when X=40.

When the value of parameter X changes from 10 to 20, the equalization state of the equalizer changes from EQ2 to EQ1. This could be an abrupt change and aesthetically unpleasant. Line 140 represents a linear interpolation between points 110 and 120 based on parameter X. Every point on line 140 is an interpolated equalization state between EQ2 and EQ1. With interpolation, the transition between two equalization states can be smooth.

Figure 2:
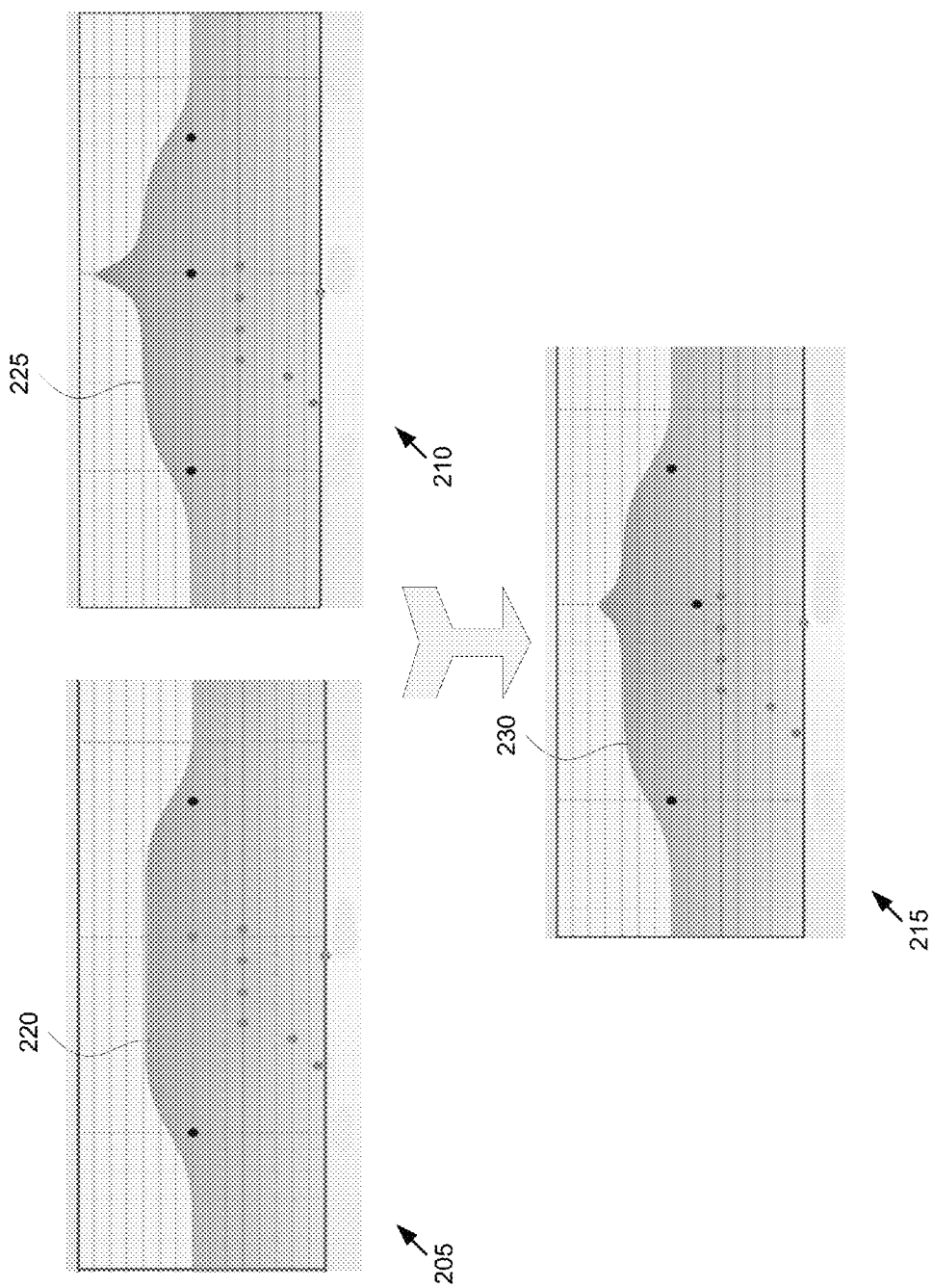
FIG. 2 illustrates an example of linear interpolation between two equalization states.

FIG. 2 illustrates an example of linear interpolation between two equalization states. Specifically, this figure shows a first equalization state 205, a second equalization state 210, and an interpolated equalization state 215 that is interpolated between equalization states 205 and 210. Curves 220, 235, and 230 represent transfer functions of the equalization states 205, 210, and 215, respectively. As shown in FIG. 2, the curve 230 blends in between the curves 220 and 235. For example, the peak of curve 230 is greater than the peak of curve 220 but less than the peak of curve 235. Therefore, the interpolated equalization state 215 provides a smooth transition from the equalization state 205 to the equalization state 210.

Figure 3:
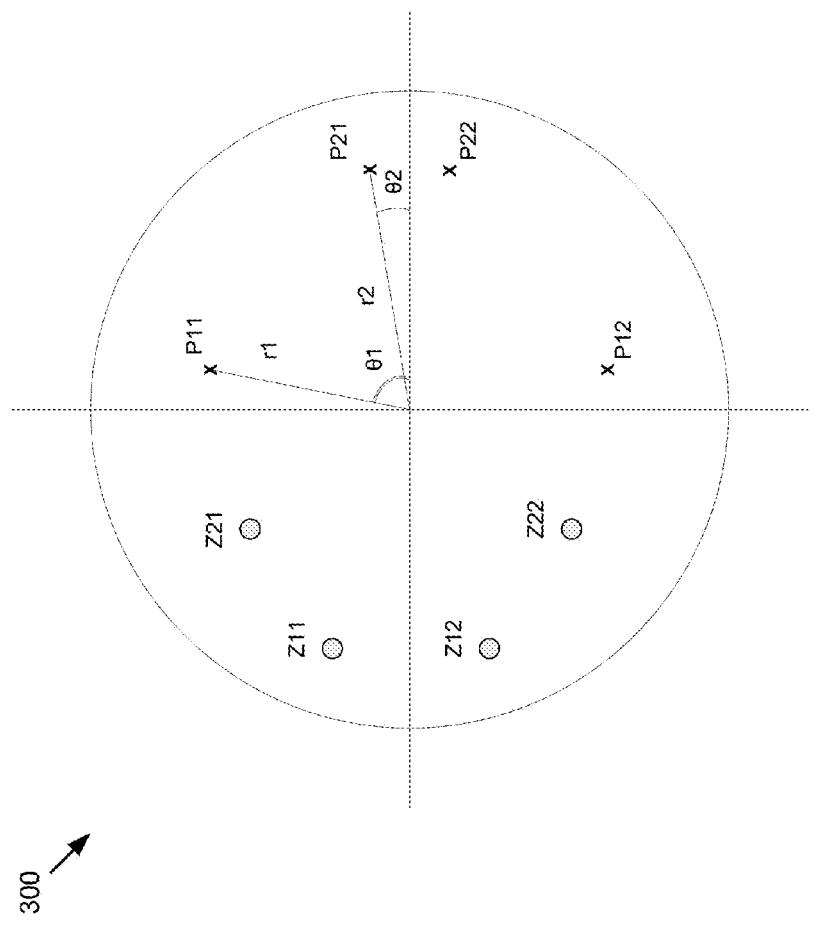
FIG. 3 illustrates an example of performing linear interpolation on corresponding Z-domain poles and zeros of two equalization states.

FIG. 3 illustrates an example of performing linear interpolation on corresponding Z-domain poles and zeros of two equalization states. Specifically, this figure shows a pole-zero plot 300 for Z-domain transfer functions of the two equalization states. As illustrated, the Z-domain transfer function for the first equalization state has two zeros ($Z_{11}$ and $Z_{12}$) and two poles ($P_{11}$ and $P_{12}$), and the Z-domain transfer function for the second equalization state has two zeros ($Z_{21}$ and $Z_{22}$) and two poles ($P_{21}$ and $P_{22}$). The position of each zero or pole in the polar coordinate system is represented by a radius and an angle. For example, the radius of $P_{11}$ is $r_1$ and the angle of $P_{11}$ is $\theta_1$. The radius of $P_{21}$ is $r_2$ and the angle of $P_{21}$ is $\theta_2$.

The radius r is the absolute value (or magnitude) of a complex number z=x+yi that corresponds to a point P on the pole-zero plot 300. The radius r represents the distance of the point P to the origin (0, 0). The radius r can be calculated by $$r=|z|=\sqrt{x^2+y^2}.$$

$\theta$ is the phase angle of the complex number z. $\theta$ can be calculated by $$\theta=\arg(z)=a\tan 2(x,y).$$

In one embodiment, in order to generate interpolated equalization states between the first equalization state and the second equalization state, linear interpolation is performed on corresponding Z-domain poles and zeros of the two equalization states based on one or more parameters that cause the transition from the first equalization state to the second equalization state. In one embodiment, for each pole or zero of the Z-domain transfer function of the first equalization state, linear interpolation is performed on that pole or zero and a corresponding pole or zero of the Z-domain transfer function of the second equalization state based on the parameters. The resulting interpolated poles and zeros can be used to construct Z-domain transfer functions of the interpolated equalization states.

For example, if the equalizer is at the first equalization state when parameter $X=x_1$ and at the second equalization state when parameter $X=x_2$, the linear interpolation between the first and second equalization states is based on the parameter X. When the equalizer transitions from the first equalization state to the second equalization state, an interpolated equalization state can be generated for each value of X from $x_1$ to $x_2$.

For instance, when $X=x_i$ ($x_1<x_i<x_2$), the interpolated equalization state is $EQ_i$. The Z-domain transfer function of $EQ_i$ has zeros $Z_{i1}$ and $Z_{i2}$ and poles $P_{i1}$ and $P_{i2}$, each of which can be calculated by performing linear interpolation on corresponding zeros and poles of the first and second equalization states. In one embodiment, in order to perform linear interpolation on two poles based on the parameters, linear interpolation is performed on the radius and angle of the two poles based on the parameters. Similarly, in order to perform linear interpolation on two zeros based on the parameters, linear interpolation is performed on the radius and angle of the two zeros based on the parameters. For example, pole $P_{i1}$ of Z-domain transfer function of the interpolated equalization state $EQ_i$ can be calculated by performing linear interpolation on pole $P_{11}$ of the first equalization state and pole $P_{21}$ of the second equalization state based on parameter X. The radius $r_i$ of pole $P_{i1}$ can be calculated by $$r_i = r_1 + (r_2 - r_1)\frac{x_i - x_1}{x_2 - x_1}$$

The angle $\theta_i$ of pole $P_{i1}$ can be calculated by $$\theta_i = \theta_1 + (\theta_2 - \theta_1)\frac{x_i - x_1}{x_2 - x_1}$$

Similarly, pole $P_{i2}$ of Z-domain transfer function of the interpolated equalization state $EQ_i$ can be calculated by performing linear interpolation on pole $P_{12}$ of the first equalization state and pole $P_{22}$ of the second equalization state based on parameter X. And zero $Z_i$ of Z-domain transfer function of the interpolated equalization state $EQ_i$ can be calculated by performing linear interpolation on zero $Z_1$ of the first equalization state and zero $Z_2$ of the second equalization state based on parameter X. The interpolated poles and zeros (e.g., $P_{i1}$, $P_{i2}$, $Z_{i2}$, and $Z_{i2}$) can be used to construct a Z-domain transfer function of an interpolated equalization state (e.g., $EQ_i$).

The linear interpolation described above is one embodiment of the disclosure. One of ordinary skill in the art will realize that in other embodiments, the number of poles and/or zeros for Z-domain transfer function of an equalization state can be different. One of ordinary skill in the art will also realize that in other embodiments the linear interpolation can be based on more than one parameter. For example, linear interpolation can be based on two parameters, three parameters, etc.

Figure 4:
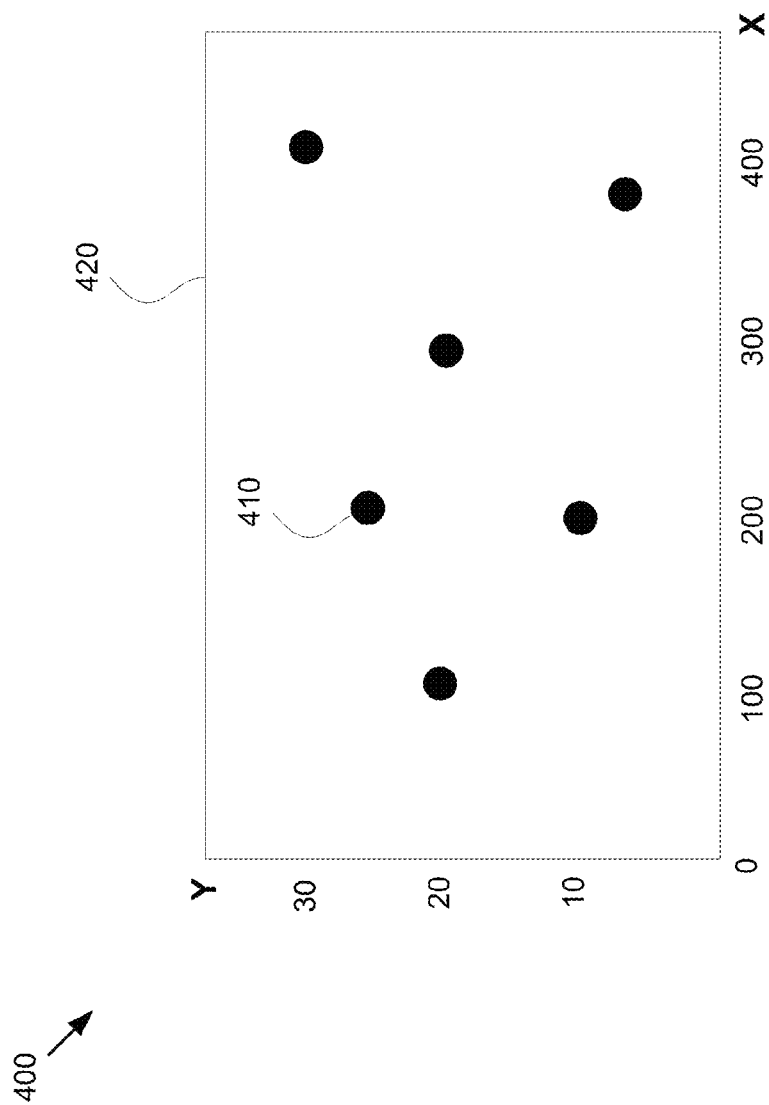
FIG. 4 illustrates an example of variable equalization states that are based on two parameters.

FIG. 4 illustrates an example of variable equalization based on two parameters. Specifically, this figure shows a chart 400 whose x-axis represents values of parameter X and y-axis represents values of parameter Y. Each point (e.g., point 410) in the two-dimensional space 420 specified by the x-axis and y-axis represents an equalization state that is based on parameters X and Y. That means when the value of X and/or Y changes, the equalizer changes from one equalization state to another equalization state. When performing linear interpolation between two points in the two-dimensional space 420, the linear interpolation is based on two parameters X and Y.

Figure 5:
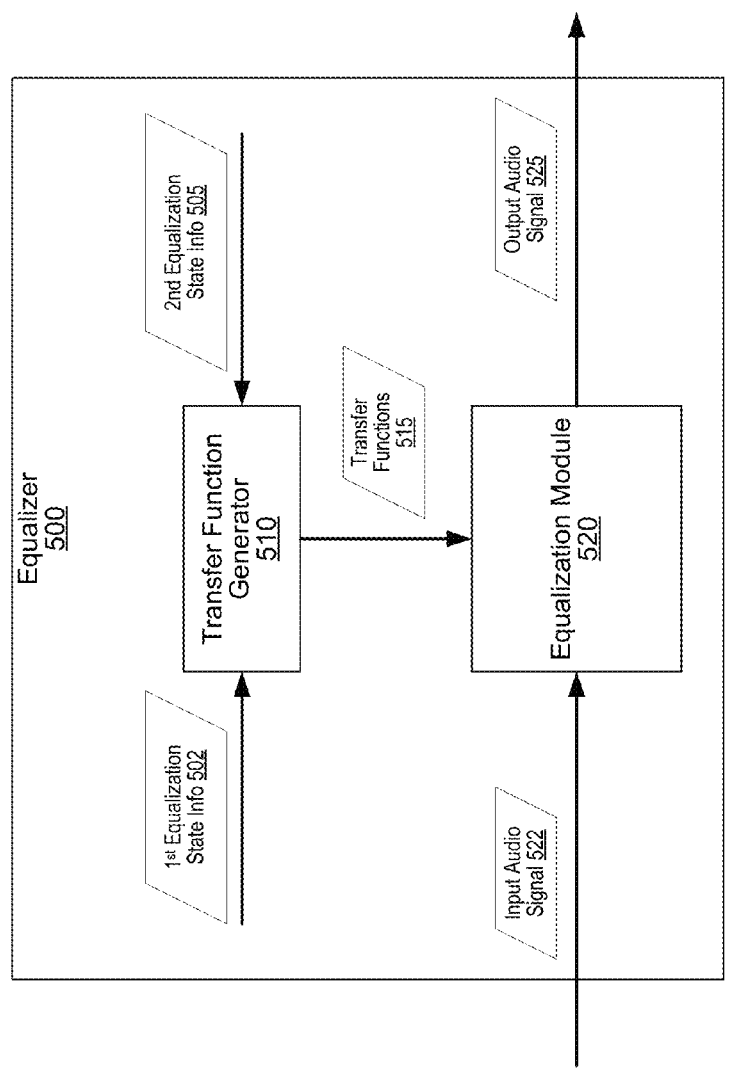
FIG. 5 illustrates a block diagram of an equalizer of one embodiment.
Figure 6:
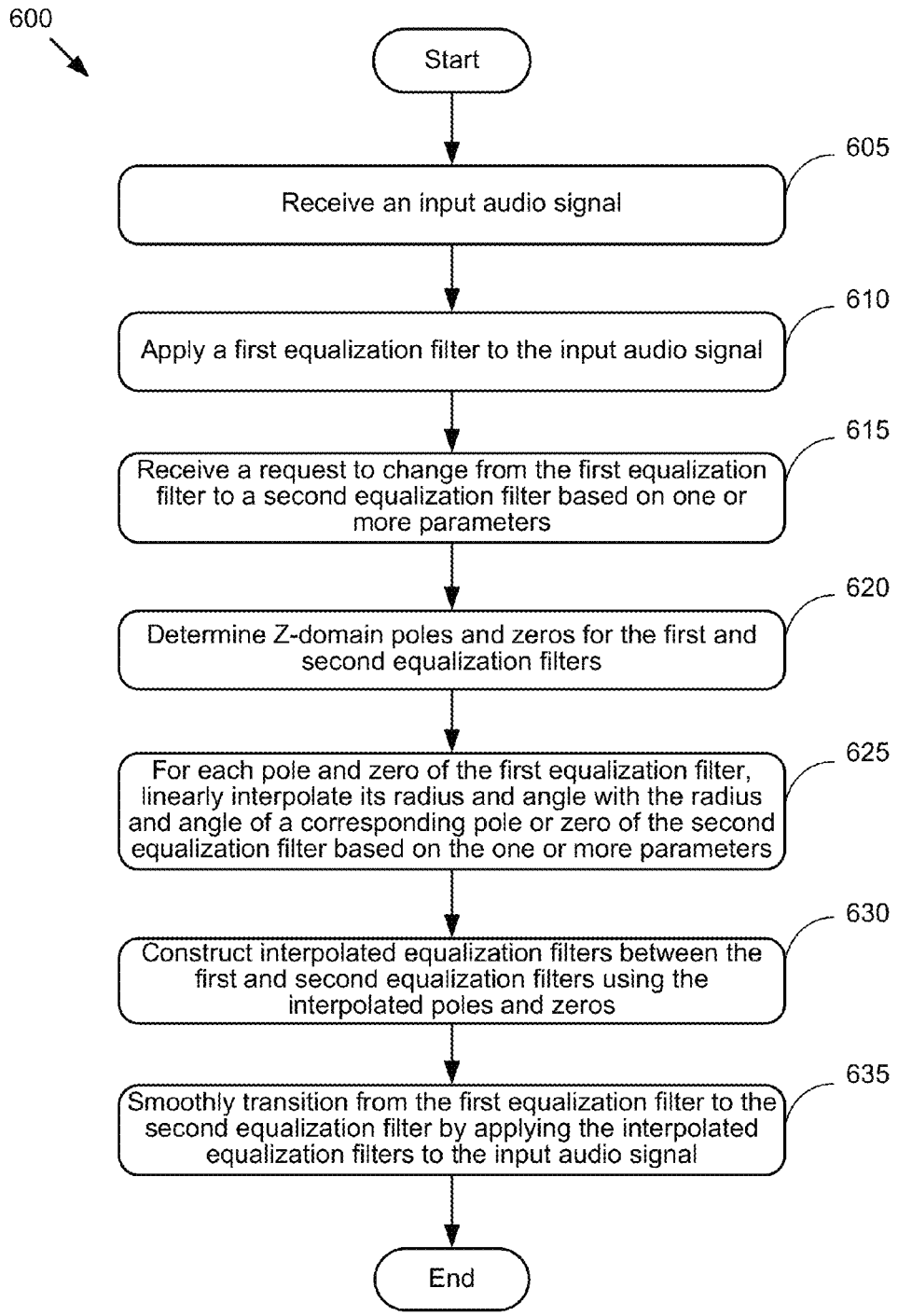
FIG. 6 illustrates a flowchart of operations performed in an equalizer.

FIG. 5 illustrates a block diagram of an equalizer 500 of one embodiment. In one embodiment, the equalizer 500 is part of an audio processor (not shown). As illustrated in FIG. 6, the equalizer 500 includes a transfer function generator 610 and an equalization module 520.

The transfer function generator 510 receives first equalization state information 502 and second equalization state information 505. The first equalization state information 502 includes information about the first equalization state of the equalizer 500. The information about the first equalization state may include the transfer function or equalization filter of the first equalization state, as well as the value of one or more parameters that determine or correspond to the first equalization state. The second equalization state information 505 includes information about the second equalization state of the equalizer 500. The information about the second equalization state may include the transfer function or equalization filter of the second equalization state, as well as the value of one or more parameters that determine or correspond to the second equalization state.

In one embodiment, the equalizer 500 receives the first equalization state information 502 and the second equalization state information 505 because the equalizer 500 tries to transition from the first equalization state to the second equalization state. In order to make the transition smoother, the transfer function generator 510 generates interpolated equalization states between the first and second equalization states by performing linear interpolation on the transfer functions of the first and second equalization states based on parameters that determine equalization state. In one embodiment, the linear interpolation is performed as described in FIG. 4 above. The transfer function generator 510 then sends the transfer functions 515 to the equalization module 520. The transfer functions 515 may include transfer functions of the interpolated equalization states, the transfer function of the first equalization state, and the transfer function of the second equalization state. In one embodiment, the transfer functions 515 are sent in a sequence in which the equalization state of the equalizer 500 gradually transitions from the first equalization state to the second equalization state.

The equalization module 520 receives an input audio signal 522 and applies the transfer functions 515 to the input audio signal 522 in the sequence that the transfer functions 515 are received. The equalization module 520 outputs the output audio signal 525 as a result of the equalization.

The equalizer 500 was described above for one embodiment of the disclosure. One of ordinary skill in the art will realize that in other embodiments, this module can be implemented differently. For instance, in one embodiment described above, certain modules are implemented as software modules for example to be executed by an application processor or a system-on-chip (SoC). However, in another embodiment, some or all of the modules might be implemented by hardware or programmable logic gates, which can be dedicated application specific hardware (e.g., an application specific integrated circuit, ASIC chip or component) or a general purpose chip (e.g., a microprocessor or field programmable gate array, FPGA).

FIG. 6 illustrates a flowchart of operations performed in an equalizer, referred to as process 600. In one embodiment, the equalizer (e.g., the equalizer 500 of FIG. 5) executes process 600 when the equalizer transitions from one equalization state to another equalization state, i.e., switching from one equalization filter to another equalization filter. As illustrated in FIG. 6, process 600 begins by receiving (at block 605) an input audio signal.

At block 610, process 600 applies a first equalization filter to the input audio signal. In one embodiment, the equalization module 520 described in FIG. 5 above performs this operation.

At block 615, process 600 receives a request to change from the first equalization filter to a second equalization filter based on one or more parameters. At block 620, process 600 determines Z-domain poles and zeros for transfer functions of the first and second equalization filters. In one embodiment, this operation is performed by the transfer function generator 510 described in FIG. 5 above.

For each pole and zero of the first equalization filter, process 600 linearly interpolates (at block 625) its radius and angle with the radius and angle of a corresponding pole or zero of the second equalization filter based on the one or more parameters. In one embodiment, this operation is performed by the transfer function generator 510 described in FIG. 5 above. In one embodiment, the linear interpolation performed at block 625 is the same as the one described above in FIG. 3.

At block 630, process 600 constructs interpolated equalization filters between the first and second equalization filters using the interpolated poles and zeros. In one embodiment, the transfer function generator 510 described in FIG. 5 above performs this function.

Process 600 smoothly transitions (at block 635) from the first equalization filter to the second equalization filter by applying the interpolated equalization filters to the input audio signal. In one embodiment, the equalization module 520 described in FIG. 5 above performs this operation.

One of ordinary skill in the art will recognize that process 600 is a conceptual representation of the operations executed by the equalizer. The specific operations of process 600 may not be performed in the exact order shown and described. The specific operations may not be performed in one continuous series of operations, and different specific operations may be performed in different embodiments. Furthermore, process 600 could be implemented using several sub-processes, or as part of a larger macro process.

Figure 7:
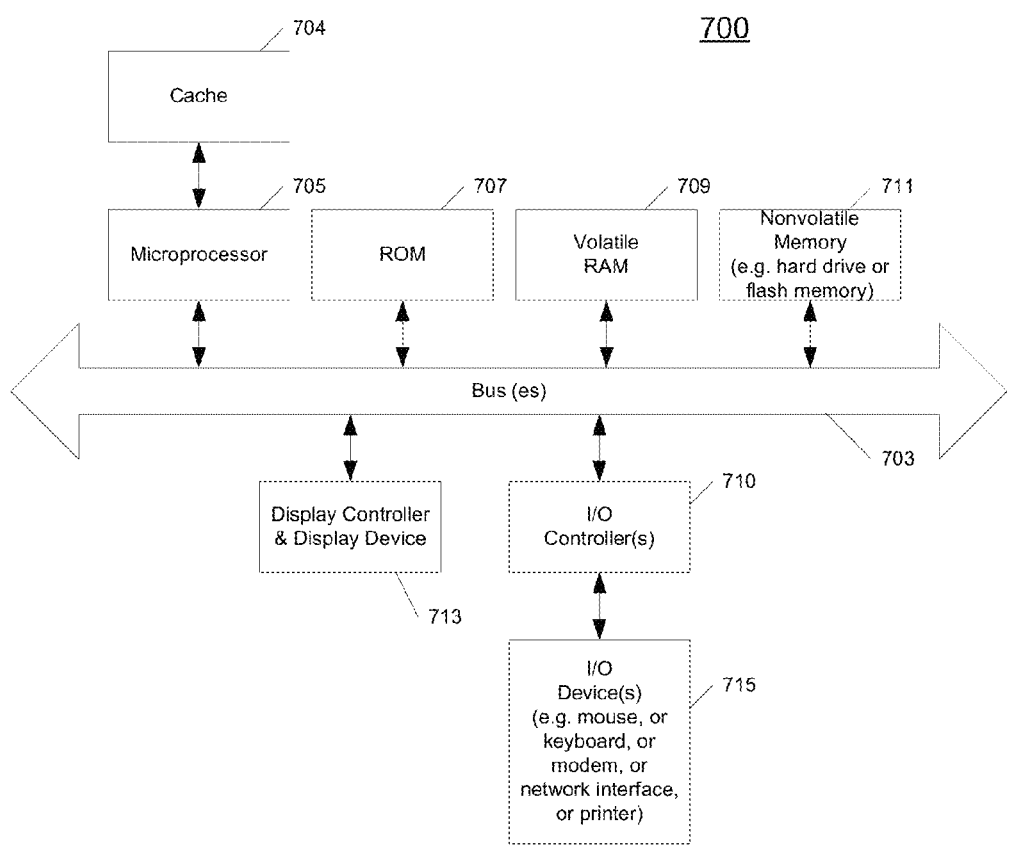
FIG. 7 illustrates one example of a data processing system, which may be used with one embodiment.

FIG. 7 shows one example of a data processing system 700, which may be used with one embodiment. For example, the system 700 may be implemented including an equalizer 500 as shown in FIG. 5. Note that while FIG. 7 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 7, the device 700, which is a form of a data processing system, includes a bus 703 which is coupled to a microprocessor(s) 705 and a ROM (Read Only Memory) 707 and volatile RAM 709 and a non-volatile memory 711. The microprocessor 705 may retrieve the instructions from the memories 707, 709, 711 and execute the instructions to perform operations described above. The bus 703 interconnects these various components together and also interconnects these components 705, 707, 709, and 711 to a display controller and display device 713 and to peripheral devices such as input/output (I/O) devices 715 which may be mice, keyboards, modems, network interfaces, printers and other devices which are well known in the art. Typically, the input/output devices 715 are coupled to the system through input/output controllers 710. The volatile RAM (Random Access Memory) 709 is typically implemented as dynamic RAM (DRAM), which requires power continually in order to refresh or maintain the data in the memory.

The non-volatile memory 711 is typically a magnetic hard drive or a magnetic optical drive or an optical drive or a DVD RAM or a flash memory or other type of memory system which maintains data (e.g., large amounts of data) even after power is removed from the system. Typically, the non-volatile memory 711 will also be a random access memory, although this is not required. While FIG. 7 shows that the non-volatile memory 711 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 703 may include one or more buses connected to each other through various bridges, controllers and/or adapters as is well known in the art.

Figure 8:
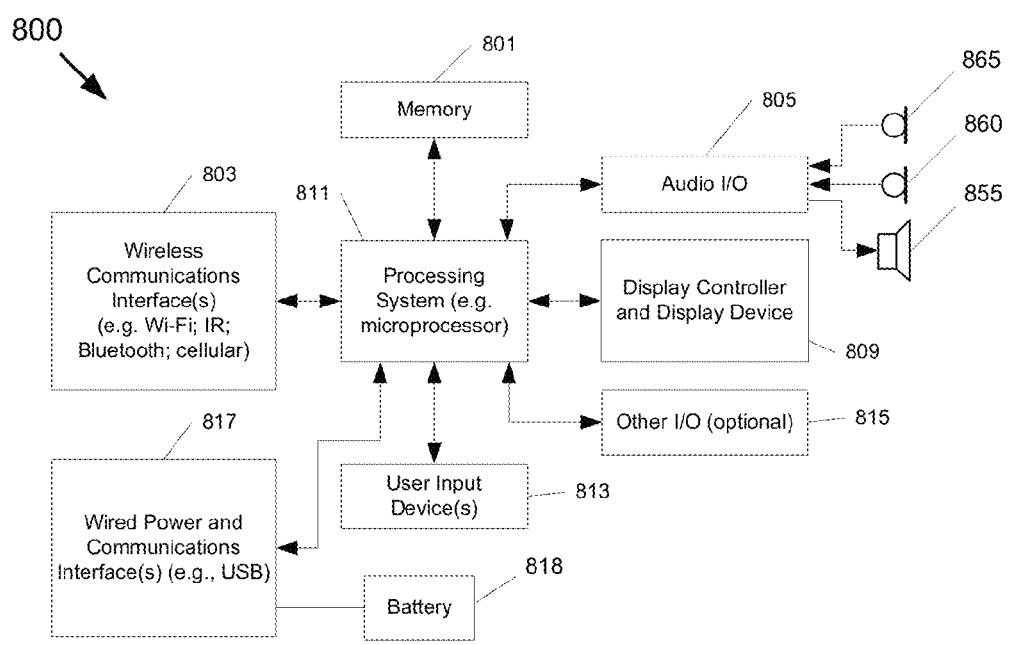
FIG. 8 illustrates one example of another data processing system, which may be used with one embodiment.

FIG. 8 shows an example of a data processing system 800 which may be used with one embodiment. Specifically, this figure shows a data processing system 800. The data processing system 800 shown in FIG. 8 includes a processing system 811, which may be one or more microprocessors or a system on a chip integrated circuit. The data processing system 800 also includes memory 801 for storing data and programs for execution by the processing system 811. The data processing system 800 also includes an audio input/output subsystem 805, which may include a primary microphone 865, a secondary microphone 860, and a speaker 855, for example, for playing back music or providing telephone functionality through the speaker and microphones.

A display controller and display device 809 provide a digital visual user interface for the user; this digital interface may include a graphical user interface similar to that shown on a Macintosh computer when running the OS X operating system software, or an Apple iPhone when running the iOS operating system, etc. The system 800 also includes one or more wireless communications interfaces 803 to communicate with another data processing system, such as the system 800 of FIG. 8. A wireless communications interface may be a WLAN transceiver, an infrared transceiver, a Bluetooth transceiver, and/or a cellular telephony transceiver. It will be appreciated that additional components, not shown, may also be part of the system 800 in certain embodiments, and in certain embodiments fewer components than shown in FIG. 8 may also be used in a data processing system. The system 800 further includes one or more wired power and communications interfaces 817 to communicate with another data processing system. The wired power and communications interface may be a USB port, etc. and may connect to a battery 818.

The data processing system 800 also includes one or more user input devices 813, which allow a user to provide input to the system. These input devices may be a keypad or keyboard, or a touch panel or multi touch panel. The data processing system 800 also includes an optional input/output device 815 which may be a connector for a dock. It will be appreciated that one or more buses, not shown, may be used to interconnect the various components as is well known in the art. The data processing system shown in FIG. 8 may be a handheld device or a personal digital assistant (PDA), or a cellular telephone with PDA-like functionality, or a handheld device which includes a cellular telephone, or a media player such as an iPod, or a device which combines aspects or functions of these devices such as a media player combined with a PDA and a cellular telephone in one device or an embedded device or other consumer electronic devices. In other embodiments, the data processing system 800 may be a network computer or an embedded processing device within another device or other type of data processing systems, which have fewer components or perhaps more components than that shown in FIG. 8.

At least certain embodiments of the disclosure may be part of a digital media player, such as a portable music and/or video media player, which may include a media processing system to present the media, a storage device to store the media and may further include a radio frequency (RF) transceiver (e.g., an RF transceiver for a cellular telephone) coupled with an antenna system and the media processing system. In certain embodiments, media stored on a remote storage device may be transmitted to the media player through the RF transceiver. The media may be, for example, one or more of music or other audio, still pictures, or motion pictures.

The portable media player may include a media selection device, such as a click wheel input device on an iPod® or iPod Nano® media player from Apple, Inc. of Cupertino, Calif., a touch screen input device, pushbutton device, movable pointing input device or other input device. The media selection device may be used to select the media stored on the storage device and/or the remote storage device. The portable media player may, in at least certain embodiments, include a display device which is coupled to the media processing system to display titles or other indicators of media being selected through the input device and being presented, either through a speaker or earphone(s), or on the display device, or on both display device and a speaker or earphone(s). Examples of a portable media player are described in U.S. Pat. Nos. 7,345,671 and 7,627,343, both of which are incorporated herein by reference.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a computer readable storage medium, such as, but not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a device bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The digital signal processing operations described above, such as audio compression, can all be done either entirely by a programmed processor, or portions of them can be separated out and be performed by dedicated hardwired logic circuits.

The foregoing discussion merely describes some exemplary embodiments of the disclosure. One skilled in the art will readily recognize from such discussion, from the accompanying drawings, and from the claims that various modifications can be made without departing from the spirit and scope of the disclosure.

What is claimed is:

1. An audio processor comprising:
  a transfer function generator that is to generate a set of interpolated transfer functions by performing linear interpolation on a first equalization state and a second equalization state, wherein the linear interpolation is performed on corresponding Z-domain poles and zeros of transfer functions of the first and second equalization states; and an equalization module that is to apply the set of interpolated transfer functions generated by the transfer function generator to an input audio signal.

2. The audio processor of claim 1, wherein performing the linear interpolation on corresponding Z-domain poles and zeros of the transfer functions of the first and second equalization states comprises:

for each pole of the transfer function of the first equalization state, performing linear interpolation on the pole and a corresponding pole of the transfer function of the second equalization state; and for each zero of the transfer function of the first equalization state, performing linear interpolation on the zero and a corresponding zero of the transfer function of the second equalization state.

3. The audio processor of claim 2, wherein the performing of linear interpolation on two poles comprises performing linear interpolation on radius of the two poles and performing linear interpolation on angle of the two poles.

4. The audio processor of claim 2, wherein the performing of linear interpolation on two zeros comprises performing linear interpolation on radius of the two zeros and performing linear interpolation on angle of the two zeros.

5. The audio processor of claim 1, wherein the linear interpolation generates a set of interpolated equalization states.

6. The audio processor of claim 5, wherein each of the set of interpolated transfer functions corresponds to an interpolated equalization state of the set of interpolated equalization states.

7. The audio processor of claim 6, wherein the equalization module is to apply the set of interpolated transfer functions in a sequence in which the set of interpolated equalization states gradually transition from the first equalization state to the second equalization state.

8. The audio processor of claim 1, wherein the equalization module is further to apply transfer functions of the first equalization state and the second equalization state.

9. The audio processor of claim 1, wherein each equalization state is defined based on a set of parameters, wherein the linear interpolation is performed based on the set of parameters.

10. A method for audio equalization comprising:

for an input audio signal, receiving a request to change from a first equalization filter to a second equalization filter;

performing linear interpolation on the first equalization filter and the second equalization filter to generate a set of interpolated equalization filters between the first and second equalization filters, wherein the linear interpolation is performed on corresponding Z-domain poles and zeros of the first equalization filter and the second equalization filter; and applying the set of interpolated equalization filters to the input audio signal.

11. The method of claim 10, wherein the method further comprises constructing the set of interpolated equalization filters using the interpolated poles and zeros.

12. The method of claim 10, further comprising determining the Z-domain poles and zeros for the first and second equalization filters.

13. The method of claim 10, wherein the performing of linear interpolation on corresponding Z-domain poles and zeros of the first and second equalization filters comprises:

for each pole of the first equalization filter, performing linear interpolation on the pole and a corresponding pole of the second equalization filter; and for each zero of the first equalization filter, performing linear interpolation on the zero and a corresponding zero of the second equalization filter.

14. The method of claim 13, wherein the performing of linear interpolation on two poles comprises performing linear interpolation on radius of the two poles and performing linear interpolation on angle of the two poles.

15. The method of claim 13, wherein the performing of linear interpolation on two zeros comprises performing linear interpolation on radius of the two zeros and performing linear interpolation on angle of the two zeros.

16. The method of claim 10 further comprising:
receiving the input audio signal;
applying the first equalization filter to the input audio signal; and
applying the second equalization filter to the input audio signal.

17. The method of claim 10, wherein each equalization filter is determined based on a set of parameters, wherein the linear interpolation is performed based on the set of parameters.

18. The method of claim 10, wherein the set of interpolated equalization filters are applied in a sequence in which the set of interpolated equalization filters gradually transition from the first equalization filter to the second equalization filter.

* * * * *